United States Patent
Hong et al.

(10) Patent No.: US 8,730,732 B2
(45) Date of Patent: May 20, 2014

(54) SEMICONDUCTOR MEMORY DEVICE AND METHOD OF FABRICATION AND OPERATION

(75) Inventors: Sung-Min Hong, Pleasanton, CA (US); Tae-Kyung Kim, Palo Alto, CA (US); Woosung Choi, Pleasanton, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 189 days.

(21) Appl. No.: 13/340,577

(22) Filed: Dec. 29, 2011

(65) Prior Publication Data

US 2013/0170302 A1  Jul. 4, 2013

(51) Int. Cl.
*G11C 16/06* (2006.01)

(52) U.S. Cl.
USPC ............... 365/185.17; 365/63; 365/185.05

(58) Field of Classification Search
USPC ........... 365/185.05, 185.17, 63; 257/314, 324
See application file for complete search history.

(56) References Cited

U.S. PATENT DOCUMENTS

| 7,242,613 B2 * | 7/2007 | Sakui et al. | 365/185.05 |
| 7,551,467 B2 * | 6/2009 | Roohparvar | 365/63 |
| 2006/0050559 A1 * | 3/2006 | Sakui et al. | 365/185.17 |

* cited by examiner

*Primary Examiner* — Gene Auduong
(74) *Attorney, Agent, or Firm* — Sughrue Mion, PLLC

(57) ABSTRACT

A non-volatile semiconductor memory device comprises a semiconductor substrate and a plurality of gate structures formed on a cell region of the semiconductor substrate. The plurality of gate structures include: a first select-gate structure and a second select-gate structure disposed on the cell region, the first select-gate structure and the second select-gate structure spaced apart from each other, and a plurality of cell gate structures disposed between the first select-gate structure and the second select-gate structure. At least one of the select-gate structures comprises plural select gates.

26 Claims, 7 Drawing Sheets

SEMICONDUCTOR MEMORY DEVICE AND METHOD OF FABRICATION AND OPERATION

FIELD OF THE INVENTION

The present invention generally relates to semiconductor devices and, more particularly, to semiconductor memory devices and methods of fabricating and operation of the same.

DESCRIPTION OF RELATED ART

Semiconductor devices such as non-volatile memory devices allow retention of information even without a supply of power. There is a continuing trend in scaling down the size of gate structures and minimizing the space between adjacent gate structures in such semiconductor devices. For example, the scaling down of the NAND Flash memory continues because the density and the semiconductor device chip size are important factors in pricing.

However, such scaling down is hindered by a number of limitations. One of the limitations of scaling down NAND cells is leakage currents including both the Band to Band Tunneling (BTBT) induced Gate Induced Drain Leakage (GIDL) and the junction leakage, which need to be reduced. Another limitation is the increased short channel effect at Select Transistors as they should also be scaled down. Since the Select Transistors turn a NAND memory cell string on and off, the increased leakage from the transistors reduces the data retention efficiency and reliability of the memory cells.

BRIEF SUMMARY OF THE INVENTION

According to an embodiment of the invention, a non-volatile semiconductor memory device comprises a semiconductor substrate and a plurality of gate structures formed on a cell region of the semiconductor substrate. The plurality of gate structures include: a first select-gate structure and a second select-gate structure disposed on the cell region, the first select-gate structure and the second select-gate structure spaced apart from each other, and a plurality of cell gate structures disposed between the first select-gate structure and the second select-gate structure. At least one of the select-gate structures comprises plural select gates.

In one embodiment, each select-gate structure comprises plural serially connected adjacent select gates. In one embodiment, said plural select gates are of different sizes. In one embodiment, said plural select gates are electrically biased differently. In one implementation, a first select gate is biased to function mainly as a select-line gate and a second select gate is biased to function mainly to reduce leakage currents. A first select gate is biased at a lower voltage than a second select gate that is proximate a cell gate. In one implementation, a first select gate is biased to function mainly as a select-line gate and a second select gate, proximate a cell gate, is biased to function mainly to reduce leakage currents, wherein the second select gate is biased at a higher voltage than the first select gate.

In another embodiment of the invention, a non-volatile semiconductor memory device comprises plural adjacent select gates disposed on a semiconductor substrate, wherein the adjacent select gates are serially connected, a select-gate structure disposed on the semiconductor substrate, wherein the select-gate structure is spaced apart from the plural adjacent select gates, and plural cell gate structures disposed between the select-gate structure and the plural adjacent select gates. In one embodiment, said plural select gates are of different sizes. In one embodiment, said plural select gates are electrically biased differently.

In another embodiment, the present invention provides a method of fabricating said non-volatile semi-conductor memory devices.

These and other features, aspects and advantages of the present invention will become understood with reference to the following description, appended claims and accompanying figures.

DETAILED DESCRIPTION OF THE INVENTION

Embodiments of the invention relate to semiconductor devices, such as NAND flash memory devices, and methods of fabrication and operation of the same. According to an embodiment of the invention, a non-volatile semiconductor memory device has reduced leakage currents (e.g., one or more of GIDL and junction leakage currents) and reduced program disturb, without increasing device chip area. The reduced GIDL current results in reduced GIDL induced disturb. Embodiments of the invention further allow scaling down NAND Flash memory chip size. NAND Flash memory stores information utilizing an array of memory cells comprising floating gate transistors.

According to an embodiment of the invention, a non-volatile semiconductor memory device comprises a semiconductor substrate and a plurality of gate structures formed on a cell region of the semiconductor substrate. The plurality of gate structures include a first select-gate structure and a second select-gate structure disposed on the cell region. The first select-gate structure and the second select-gate structure are spaced apart from each other. The plurality of the gate structures further include a plurality of cell gate structures disposed between the first select-gate structure and the second select-gate structure. At least one of the select-gate structures comprises plural select gates.

Figure 1:
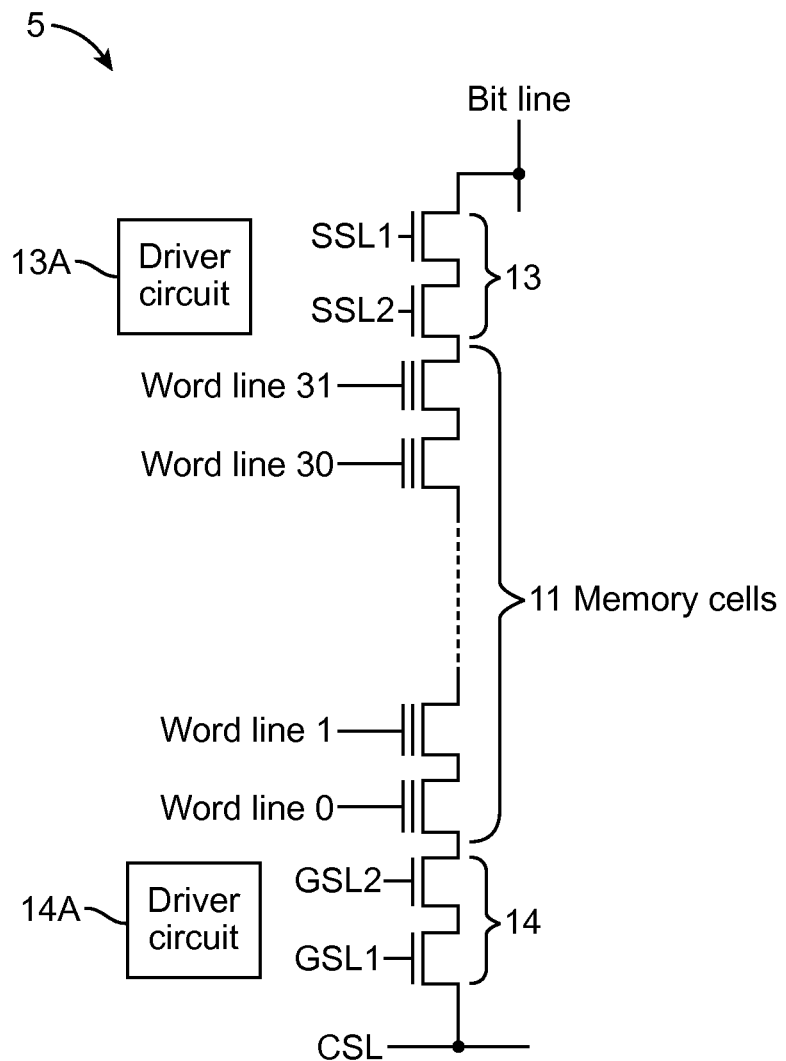
FIG. 1 shows a circuit diagram of a NAND flash memory array, according to an embodiment of the invention.

A conventional NAND memory cell string comprises one ground-select-line (GSL) transistor and one string-select-line (SSL) transistor. According to an embodiment of the invention, a NAND flash memory array comprises select-gate structures wherein at least one select-gate structure comprises multiple series connected select gate transistors. In one embodiment, a select-gate structure includes two or more ground-select-line series transistors (e.g., GSL1, GSL2) and another select-gate structure includes two or more string-select-line transistors (e.g., SSL1, SSL2). FIG. 1 is a circuit diagram of a NAND flash memory array 5, according to an embodiment of the invention. The NAND flash memory array 5 comprises select-gate structures 13 and 14, wherein the SSL side select-gate structure 13 includes a first string-select-line (SSL1) transistor and a second string-select-line (SSL2) transistor. The GSL side select-gate structure 14 includes a first ground-select-line (GSL1) transistor and a second ground-select-line (GSL2) transistor. The NAND flash memory array 5 further comprises a common source line (CSL), a plurality of wordlines (e.g., 32 word lines WL 0-31), and at least a bit line (BL) crossing the other lines. FIG. 1 is a circuit diagram and as such it os not indicative of the physical spacing between the components of the NAND flash memory array. Other figures (e.g., FIG. 2) are more indicative of the spacing between the components of the NAND flash memory array.

Figure 2:
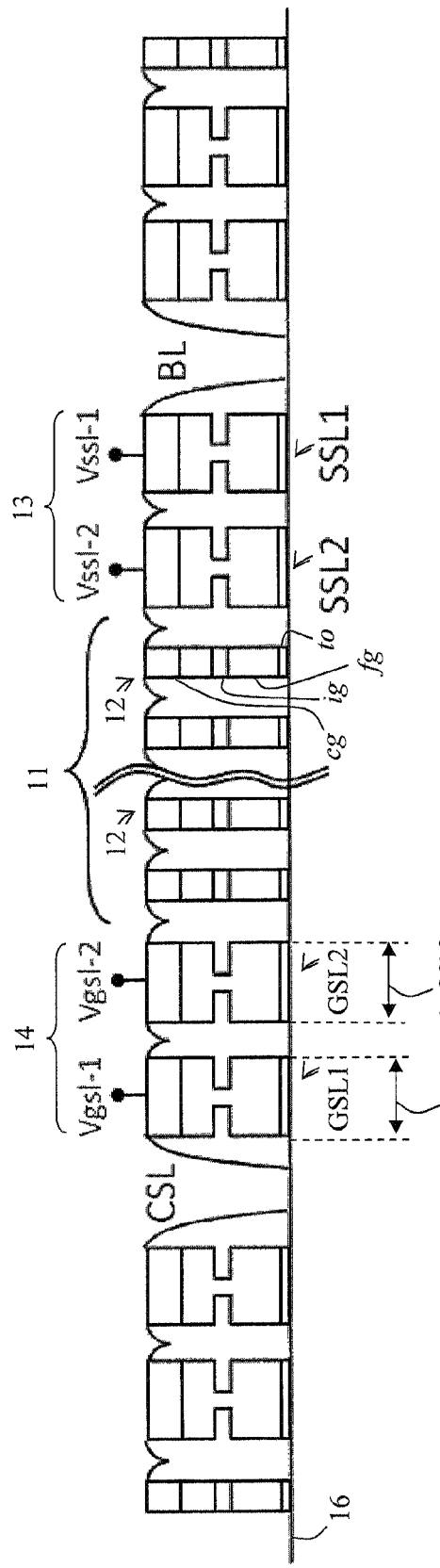
FIG. 2 shows a cross-sectional view of a NAND flash memory structure, according to an embodiment of the invention.

FIG. 2 shows a view of an embodiment of a NAND flash memory semiconductor device 10, according to an embodiment of the invention. Specifically, FIG. 2 is a cross-sectional view of the device structure taken along the bit line direction. The device 10 comprises an array 11 of cells (gate structures) 12. In the word line direction, a cell transistor gate structure may include an essentially laminar structure including a control gate cg, an inter-gate dielectric layer ig, a floating gate fg, a tunnel oxide to, and isolation regions formed/disposed on a semiconductor substrate 16.

The set of cells 12 along the bit line is called a string. The device 10 further comprises a select-gate structure 13 comprising multiple select gates including string-select-line transistors SSL1 and SSL2. The device 10 further comprises a select-gate structure 14 comprising multiple select gates including ground-select-line transistors GSL1 and GSL2. The select-gate structures 13 and 14 selectively control the on/off states of the string (array) 11.

In one embodiment, the select-gate structure comprising the string-select-line transistors SSL1 and SSL2 include series connected metal-oxide-semiconductor (MOS) transistors, and the select-gate structure comprising ground-select-line transistor GSL1 and GSL2 comprise series connected MOS transistors.

In one embodiment, the string-select-line transistors SSL1 and SSL2 have separate gate electrodes to which selected (e.g., optimized) bias conditions are applied to achieve a lower leakage current level. In one example, bias voltages Vssl-1 and Vssl-2 are applied to gate electrodes of SSL1 and SSL2, respectively. Further, the ground-select-line transistors GSL1 and GSL2 have separate gate electrodes to which selected (e.g., optimized) bias condition are applied to achieve a lower leakage current level. In one example, bias voltages Vgsl-1 and Vgsl-2 are applied to gate electrodes of GSL1 and GSL2, respectively.

FIG. 2 illustrates select-gate structures comprising dual select transistor structures 13 and 14, wherein within each dual select transistor structure includes two transistors connected in series. Specifically, in the dual select-gate structure 13, the transistors SSL1 and SSL2 are connected in series to function as a string-select-line side switch. Further, in the dual select-gate structure 14 the transistors GSL1 and GSL2 are connected in series to function as a ground-select-line side switch.

As noted, in one embodiment of the invention, the transistors SSL1 and SSL2 have separate gate electrodes to which optimized bias conditions are applied to achieve a lower leakage current level. Similarly, the transistors GSL1 and GSL2 have separate gate electrodes to which optimized bias condition are applied to achieve a lower leakage current level. As such, each series connected transistor in a dual select-gate structure operates in optimal conditions of its own. For example, in the dual select-gate structure 14 (i.e., GSL side), the transistor GSL2 which is closer to the word lines (or cells) 12 can have a gate bias higher than its threshold voltage to allow a voltage drop along its channel. The effect is a more gradual increase of the potential from GSL to the lowest word line that results in reduction of leakage currents including junction leakage current and GIDL, in relation to cell to cell (i.e., word line to word line) electrostatic coupling for floating gate NAND Flash cells. The transistor GSL1 next to CSL is kept off by applying zero bias voltage on the gate of transistor GSL1.

The source of the GIDL current is the Band to Band tunneling (BTBT) due to the large potential drop between the boosted channel below the word lines and the channel under GSL. Some of the BTBT generated carriers obtain high energy that is enough to allow them to go over the barrier height of the tunneling oxide of the cells (gate structures) which causes the problematic program inhibit disturb behavior in the inhibited strings. Program inhibited cell strings have a channel potential self-boosted by turning off select transistors such as the select-gate structures 13 and 14. When programming is performed according to a row decoded address, one of the word lines is selected and set to a high programming voltage Vpgm (e.g., 15~23V) and all the other word lines are applied to a pass voltage Vpass (e.g., 8-10V). According to a column decoded address, a bit line is selected to be programmed and its channel is opened by turning on the SSL select-gate structure 13. For the other bit line strings that should be inhibited from programming, the following scheme can be applied. A high Vpgm applied to the selected word line and a Vpass applied to the other word lines, lifting the channel potential when the program inhibited string is off. As a result, the channel potential of the program inhibited bit line is boosted as high as e.g., 5-7V.

In one embodiment of the invention, when the string 11 is in the program inhibit mode, the channel potential under the word lines or cells 12 (e.g., WL0, WL1, . . . , WL62, WL63) is raised as high as about 5~7V due to a self-boosting effect (i.e., larger than Vpass). At the GSL side, the transistor GSL2 is biased to have its channel turned on but remain in the saturation mode during the program inhibit mode. As a result, there is a gradual potential drop under the GSL2 gate. In comparison to conventional single ground-select-line transistor memory devices where the potential drop is concentrated between GSL and WL0, the reduced slope of the potential between GSL2 and WL0 in device 10 of FIG. 2 according to an embodiment of the invention results in reduction of the GIDL current.

During a data erase operation, instead of floating the GSL2 and/or SSL2, an optimized value of bias voltage can be applied to hold the nearest neighbor floating gates GSL1 and/or SSL1 to a low potential by electric coupling. This improves the under-erase behavior that may occur when the GSL2 and SSL2 are floated. The optimal value of applied voltage at the GSL2 and/or SSL2 transistors during the erase operation is selected as to not induce Fowler-Nordheim (FN) tunneling stress on the tunneling oxide but to pull down the floating gate potential of the nearest cells 12 (e.g., high enough not to allow electric stress by FN tunneling, but low enough to pull down the potential level of the nearest floating gate). Similar under-programming is improved during the programming of cells 12 (e.g., WL0 and WL31 in FIG. 1)

nearest to each of the select structures 14 and 13 since the select structures 14 and 13 are electrically coupled to WL0 and WL31, respectively.

In one embodiment, to achieve the optimal operation of the device 10, peripheral circuits 13A, 14A (FIG. 1) driving the select-gate structures 13 and 14, respectively, are configured to apply appropriate operation voltages for different operational modes (e.g., programming or erasing). In one example, during an erase operation of a floating gate (FG) NAND flash memory device 10 according to an embodiment of the invention, when a high positive voltage (e.g., ~15V) is applied at the common substrate 16, the bias voltages applied at the GSL2 and SSL2 transistors can be optimized as discussed. Depending on the pitch of the cells 12 and the program/erase voltages, the optimum value may range between about 5V~8V in one example.

In one embodiment, the reduction of the GIDL current in the device 10 improves the Program Inhibit Disturb at the GSL side. In one embodiment, the device 10 provides control of punch through voltage by the optimal bias conditioning of the two SSL transistors SSL1 and SSL2 at the SSL side. In one embodiment, the device 10 prevents under-erase of the bottom word line cell and the top word line cell by adjusting the GSL2 and SSL2 bias voltages.

In one embodiment, the select-gate structures are configured to minimize leakage currents including the GIDL leakage current at the SSL side. Different bias schemes are applied to the select transistors SSL1, SSL2, GSL1, GSL2 to optimize their performance during the programming, program inhibit, and erasing operations.

Figure 3:
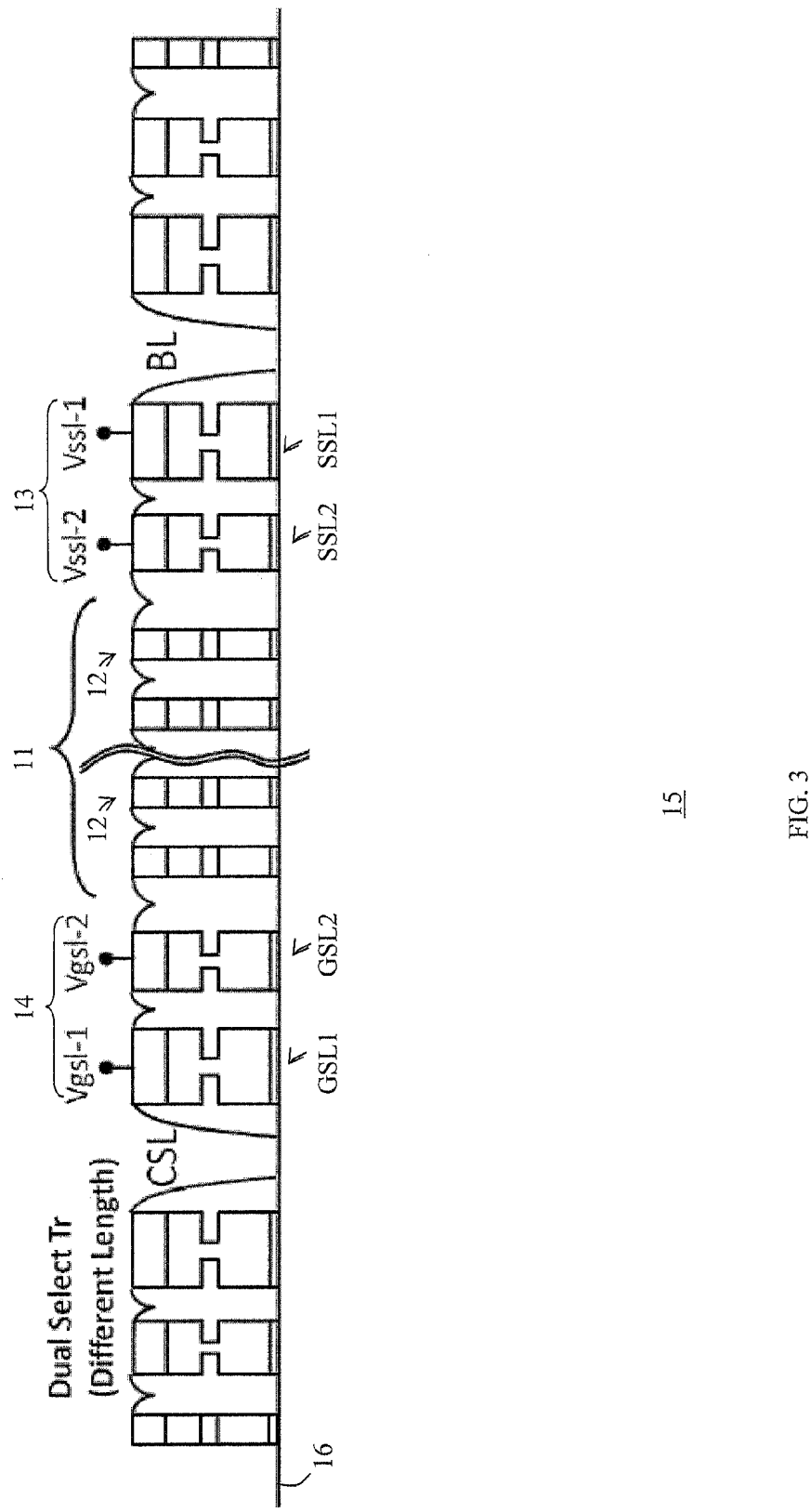
FIG. 3 shows a cross-sectional view of a NAND flash memory structure having select gates of different sizes, according to another embodiment of the invention.

FIG. 3 shows a view of an embodiment of a NAND flash memory semiconductor device 15, according to an embodiment of the invention. In this embodiment, the string-select-line transistors SSL1 and SSL2 have different lengths and different threshold voltages in order to optimize for short channel effect (SCE) and the leakage currents such as GIDL. The ground-select-line transistors GSL1 and GSL2 have different lengths and different threshold voltages in order to optimize for SCE and the GIDL leakage currents.

Figure 7:
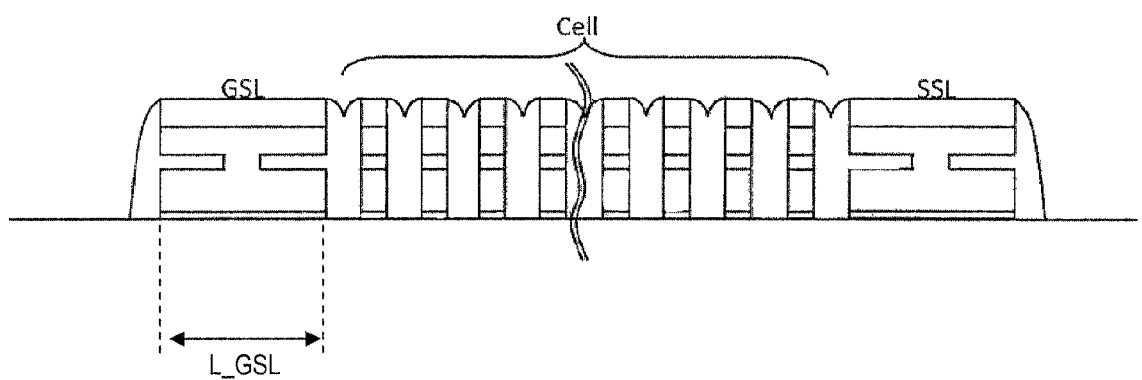
FIG. 7 shows a conventional non-volatile semiconductor memory device with a single ground-select-line transistor (GSL) and a single string-select-line transistor (SSL).

In one embodiment, the physical size of the select-line transistors in each select-gate structure can be determined by optimization, taking into account the following constraints. Due to area considerations, there is an inequality between the GSL gate length of a conventional single ground-select-line transistor (i.e., length L_GSL, as shown in FIG. 7), and the gate lengths of dual ground-select-line transistors GSL1 and GSL2 (i.e., lengths L_GSL1 and L_GSL2, as shown in FIG. 2), according to an embodiment of the invention, wherein:

$$L\_GSL >= L\_GSL1 + L\_NM + L\_GSL2,$$

where L_NM is the distance between GSL1 and GSL2 gates.

The above inequality states that no areal penalty is allowed when dual ground-select-line transistors GSL1 and GSL2 are utilized.

Further, there is minimum gate length allowable in the given technology, wherein:

$$L\_GSL1 >= L\_MIN,$$

$$L\_GSL2 >= L\_MIN,$$

where L_MIN is the minimum gate length of a select-line transistor.

A longer GSL1 transistor and a shorter GSL2 are beneficial from the viewpoint of the performance, according to an embodiment of the invention. This is because in one embodiment, the GSL1 transistor mainly functions as a ground-select-line transistor, while the GSL2 transistor modifies the electric field profile in order to reduce GIDL leakage current. The performance can be measured by two factors. A first factor is the breakdown voltage of the GSL1 transistor, compared with that of a conventional single ground-select-line transistor. The second factor is the GIDL leakage current, which is directly related to the program inhibit characteristics. Optimal length values can be determined from experimentation using the above factors.

As noted, the multiple select-line transistors per select-gate structure can be selectively applied, according to embodiments of the invention. For example, only the GSL side select-gate structure can be fabricated with two small transistors GSL1 and GSL2. In this case, the SSL side select-gate structure transistor is fabricated following the conventional method of a single string-select-line transistor. This asymmetric application is beneficial from the viewpoint of simplicity.

Figure 4:
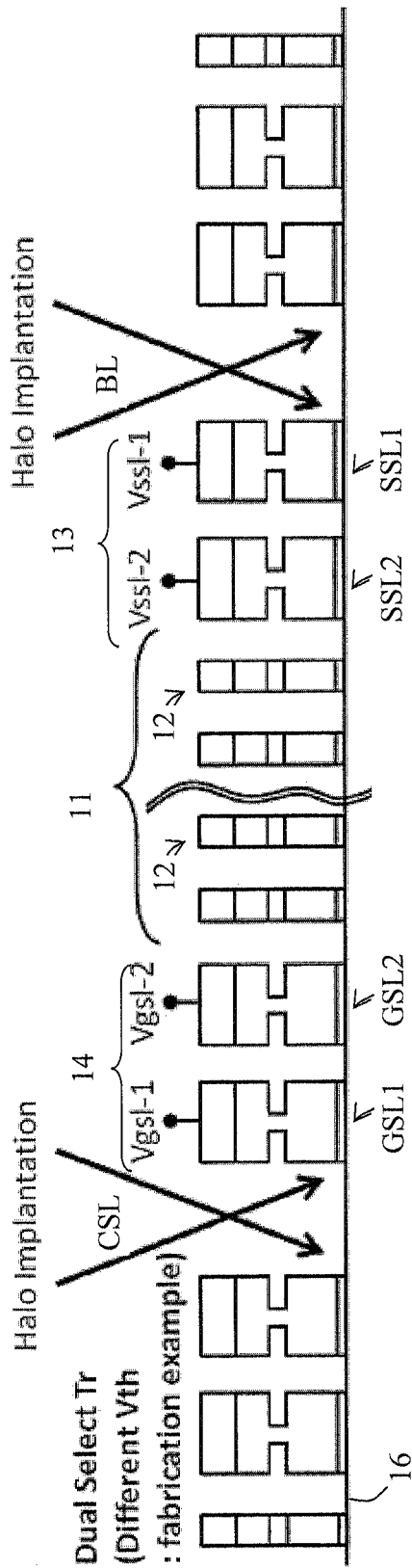
FIG. 4 shows a cross-sectional view of a NAND flash memory structure, illustrating halo implantation, according to another embodiment of the invention.

According to an embodiment of the invention, to maintain SCE in check, at least one of the select-gate structures 13 and 14 is calibrated. One calibration method comprises selective application of halo implantation during fabrication. FIG. 4 shows an embodiment of a NAND flash memory semiconductor device 20 illustrating halo implantation fabrication, according to an embodiment of the invention. Said short channel effect is reduced by halo implantation during fabrication of the device 20, such as by asymmetric halo doping.

One calibration method according to the invention comprises asymmetric application of p-type pocket doping using a halo implant to the CSL side only, whereby the transistor GSL1 is calibrated. This asymmetric p-type doping maintains the punch through voltage under transistor GSL1 in a high, tolerable range. Further, because p-type doping is not applied near the cell string 11, the doping does not increase the overall GIDL leakage from the boosted channel.

Similarly, another calibration method according to the invention comprises asymmetric application of p-type pocket doping using a halo implant to the BL side only, whereby the transistor SSL1 is so calibrated.

Another calibration method according to the invention comprises symmetric application of p-type pocket doping using a halo implant to the BL side and CSL sides, whereby the transistors SSL1 and GSL1 are so calibrated.

In one embodiment, instead of increasing the p-type doping, the length of the GSL1 transistor may be increased to maintain said SCE in check.

Figure 5:
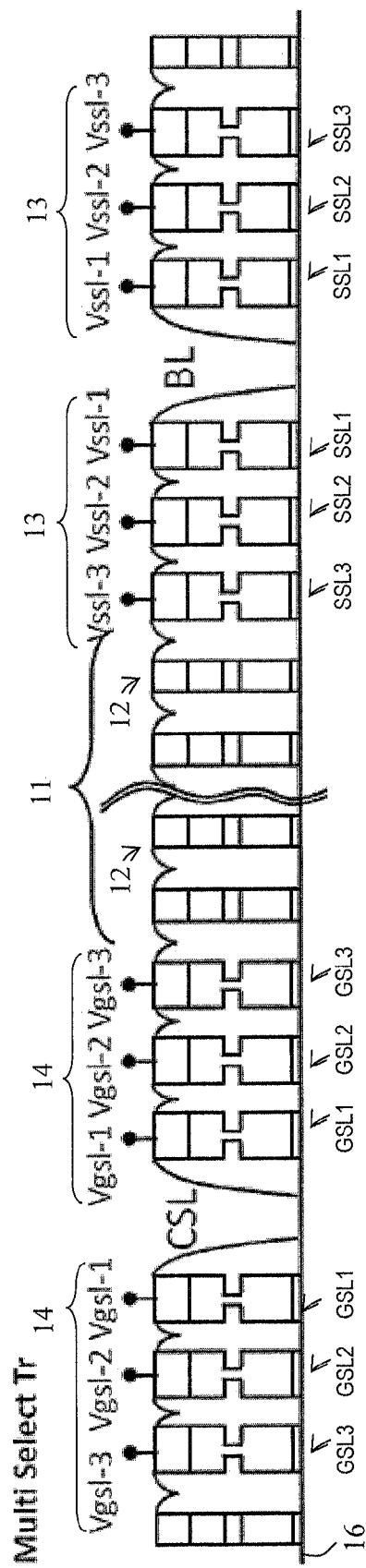
FIG. 5 shows a cross-sectional view of a NAND flash memory structure having multiple select gates in each select-gate structure, according to another embodiment of the invention.

Embodiments of the invention are not limited to two select transistors in each select-gate structure. FIG. 5 shows a view of an embodiment of a NAND flash memory semiconductor device 25, according to an embodiment of the invention. The SSL side select-gate structure 13 may include three or more series connected string-select-line transistors (e.g., SSL1, SSL2, SSL3, . . . ). Similarly, the GSL side select-gate structure 14 may include three or more series connected ground-select-line transistors (e.g., GSL1, GSL2, GSL3, . . . ). In one embodiment, the select-gate structure length is determined considering a butting process for electrically linking a control polysilicon gate with a floating polysilicon gate. In one embodiment, multiple select-gate structures can be applied to a Charge Trap Flash (CTF) memory instead of the floating gate (FG) flash memory. As such, the applicability of the invention extends to the 3D flash memory, either with vertical bit lines or vertical word lines.

According to an embodiment of the invention, the select-gate structure at the SSL side and the select-gate structure at the GSL side (e.g., select-gate structures 13 and 14) can have a different number of select transistors or not have a mirrored structure. Further, the GSL side select-gate structure may include multiple gate-select-line transistors whereas the SSL side select-gate structure may include a single string-select-line transistor, and vice versa. For example, when the junction leakage characteristic at the SSL side is to be maintained in check, a single string-select-line transistor is used in the SSL side select-gate structure, while using multiple ground-select-line transistors in the GSL side select-gate structure to suppress the GIDL at the GSL side. Further, the single string-select-transistor in the select-gate structure at the SSL side can be maintained for other advantages including area, simpler fabrication process, etc.

In one embodiment, different bias conditions are applied to the GSL1 transistor as compared to the GSL2 transistor. The GSL1 transistor mainly functions as a ground-select-line transistor, wherein the gate bias voltage of the GSL1 transistor (i.e., Vgsl-1) is kept below its threshold voltage. An example gate voltage value for GSL1 transistor is about 0V. The GSL2 transistor functions to reduce the peak electric field, and as such the gate bias voltage of the GSL2 transistor (i.e., Vgsl-2) has a value much larger than gate bias voltage of the GSL1 transistor. The gate bias voltage of the GSL2 transistor can be optimized by experimentation, and in one example, a Vgsl-2 value in the range of about 3V~8V can be applied as the gate bias voltage of the GSL2 transistor. In this voltage range, the GSL2 transistor is turned on, and the voltage difference between its source and drain terminals is distributed over its inversion channel layer. Except for setting two separate gate bias voltages Vgsl-1 and Vgsl-2, the timing of applying the gate voltages Vgsl-1 and Vgsl-2 can be maintained as in a single ground-select-line transistor.

Figure 6:
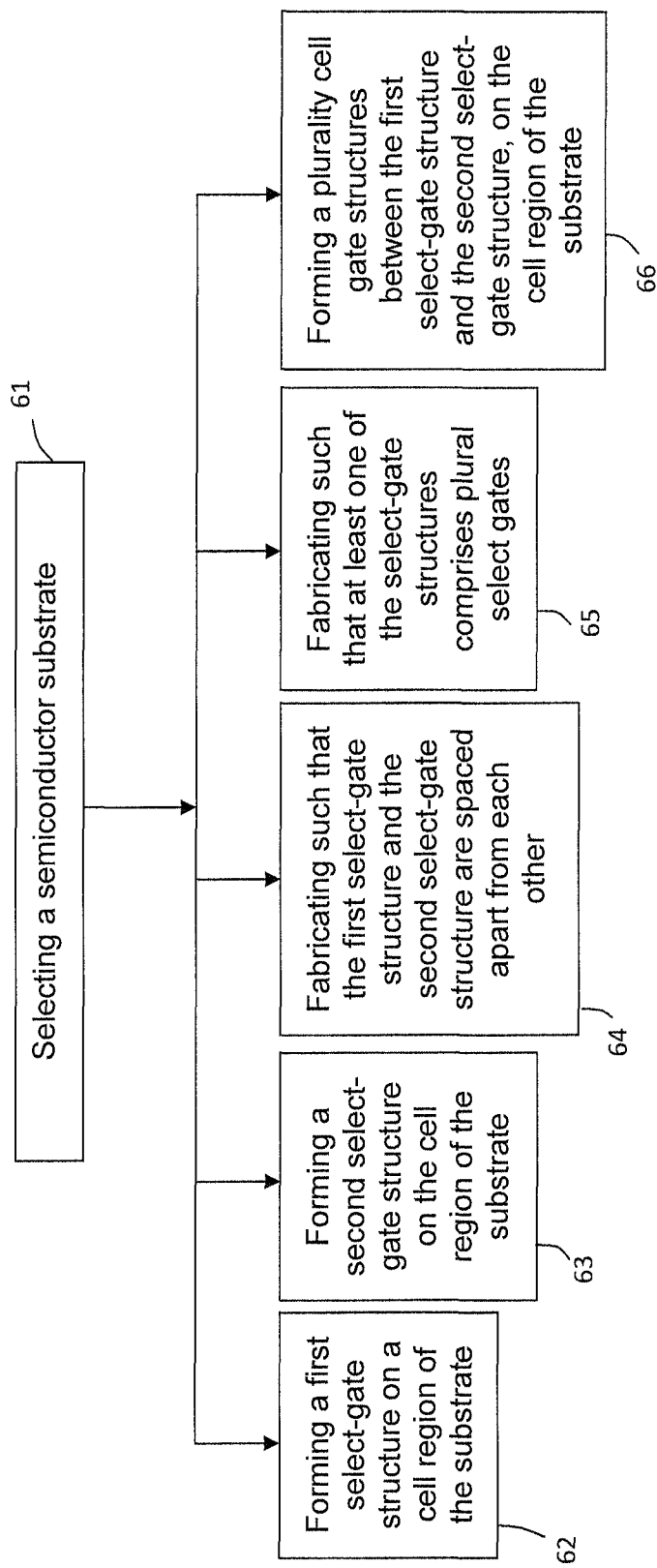
FIG. 6 shows a flowchart of a process for fabricating a non-volatile semiconductor memory device, according to an embodiment of the invention.

FIG. 6 shows a flowchart of a process 60 for fabricating a non-volatile semiconductor memory device, according to an embodiment of the invention. Generally in semiconductor fabrication, gate formation forms cell transistors and select transistors simultaneously. As such, one or more of the steps may be performed simultaneously and/or in a different sequence than the example sequence depicted herein.

Step 61 comprises selecting a semiconductor substrate. Step 62 comprises forming a first select-gate structure on a cell region of the substrate. Step 63 comprises forming a second select-gate structure on the cell region of the substrate. Step 64 comprises fabricating such that the first select-gate structure and the second select-gate structure are spaced apart from each other. Step 65 comprises fabricating such that at least one of the select-gate structures comprises plural select gates. Step 66 comprises forming a plurality cell gate structures between the first select-gate structure and the second select-gate structure, on the cell region of the substrate. Double patterning or quadruple patterning technology may fabricate cell size and larger size gates one by one In one example implementation, a method for fabricating a non-volatile semiconductor memory device comprises fabricating at least one select-gate structure comprising multiple select-line transistors with small gate lengths in order to not increase the cell string overhead. Total sum of select-gate structure length including space for multiple select-line transistors in each select-gate structure is not higher than conventional single select-line transistor select-gate structures.

In one example, spacing between multiple select-line transistors in each select-gate structure is optimized by considering junction implantation and dielectric material filling margin. Lower limit of each select-line transistor in a select-gate structure having multiple select-line transistors, is about the size of a cell word line (cell) 12, which determines the minimum fabrication process limit. In one embodiment, an open process is used between a floating poly silicon and a control poly silicon at select transistors. Using open processing (i.e., butting processing), a bias voltage for a select-line transistor directly controls the electric potential over the tunnel oxide without coupling. The open process employs photo-lithography, wherein select-gate structure size (length) is larger than opening size.

The multiple GSL/SSL select-gate structure for NAND flash memory devices, according to an embodiment of the invention, is not limited to floating gate NAND flash memory devices. Embodiments of the invention are also useful with Charge Trap Flash (CTF) memory as this type of memory device also employs GSL and SSL transistors. The same physical mechanism of program disturb exists in the CTF memory and application of the multiple GSL/SSL select-gate structure to CTF memory can reduce the disturb by reducing the GIDL current, according to embodiments of the invention. Further, embodiments of the invention are useful with any Flash memory employing the GSL/SSL transistors including 3D NAND Flash memory structures such as the vertical channel types and vertical gate types.

Semiconductor devices, e.g., non-volatile memory devices formed according to some of the embodiments described herein can be used in various electronic systems such as cellular phones, digital cameras, digital televisions, and video game systems. Additionally, the memory devices can be used in various types of memory cards such as Compact Flash, Memory Stick, xD Picture Card, Smart Media, and other multimedia card types. Further, non-volatile memory devices may be operatively coupled with other types of semiconductor devices, such as dynamic random access memory (DRAM) devices and/or microprocessors, in the foregoing applications. In some cases, a non-volatile memory such as a NAND flash memory device and a DRAM device may be incorporated together in a single integrated circuit (IC) package.

The foregoing description is illustrative and is not to be construed as limiting of the disclosure. Although a few example embodiments have been described, those skilled in the art will readily appreciate that many modifications are possible in the example embodiments without materially departing from the novel teachings and advantages of the disclosure. For example, the embodiments have been described with respect to NAND flash memory applications, but the inventive principles could also be applied to other types of memory devices, such as NOR-type flash memories. Accordingly, all such modifications are intended to be included within the scope of the disclosure as defined in the claims.

What is claimed is:

1. A non-volatile semiconductor memory device, comprising:
   a semiconductor substrate; and
   a plurality of gate structures formed on a cell region of the semiconductor substrate;
   wherein the plurality of gate structures include:
      a first select-gate structure disposed on the cell region;
      a second select-gate structure disposed on the cell region, wherein at least one of the first and second select-gate structures comprises plural select gates, and wherein the first select-gate structure and the second select-gate structure are spaced apart from each other; and
      a plurality of cell gate structures disposed between the first select-gate structure and the second select-gate structure.

2. The device of claim 1, wherein each of the first and second select-gate structures comprises plural serially connected select gates.

3. The device of claim 1, wherein said plural select gates are of different sizes.

4. The device of claim 1, wherein said plural select gates are electrically biased differently.

5. The device of claim 4, wherein a first select gate of said plural select gates is biased to function mainly as a select-line gate and a second select gate of said plural select gates is biased to function mainly to reduce leakage currents.

6. The device of claim 4, wherein a first select gate of said plural select gates is biased at a lower voltage than a second select gate of said plural select gates that is proximate to a cell gate.

7. The device of claim 3, wherein a first select gate of said plural select gates is biased to function mainly as a select-line gate and a second select gate of said plural select gates, proximate to a cell gate, is biased to function mainly to reduce gate induced drain leakage (GIDL) leakage currents, wherein the second select gate is biased at a higher voltage than the first select gate.

8. The device of claim 1, wherein the first select-gate structure comprises plural select-line transistors including serially connected string-select-line transistors.

9. The device of claim 8, wherein the second select-gate structure comprises plural select-line transistors including serially connected ground-select-line transistors.

10. The device of claim 9, wherein the first select-gate structure includes a different number of select-line transistors than the second select-gate structure.

11. The device of claim 8, wherein the second select-gate structure comprises a single ground-select-line transistor.

12. The device of claim 1, wherein the second select-gate structure comprises plural select-line transistors including serially connected ground-select-line transistors.

13. The device of claim 12, wherein the first select-gate structure comprises a single string-select-line transistor.

14. The device of claim 12, wherein a select gate in at least one of the first and second select-gate structures is calibrated by halo implantation during fabrication including asymmetric application of p-type pocket doping using a halo implant whereby said select gate is calibrated.

15. The device of claim 1, further comprising a floating gate disposed on the semiconductor substrate.

16. The device of claim 1, further comprising a first driving circuit configured to drive the first select-gate structure and a second driving circuit configured to drive the second select-gate structure.

17. A non-volatile semiconductor memory device, comprising:
   plural adjacent select gates disposed on a semiconductor substrate, wherein the adjacent select gates are serially connected;
   a select-gate structure disposed on the semiconductor substrate, wherein the select-gate structure is spaced apart from the plural adjacent select gates; and
   plural cell gate structures disposed between the select-gate structure and the plural adjacent select gates.

18. The device of claim 17, wherein said plural adjacent select gates are of different sizes.

19. The device of claim 17, wherein said plural adjacent select gates are electrically biased differently.

20. The device of claim 19, wherein a first select gate of said plural adjacent select gates is biased to function mainly as a select-line gate and a second select gate of said plural adjacent select gates is biased to function mainly to reduce leakage currents.

21. The device of claim 19, wherein a first select gate of said plural adjacent select gates is biased at a lower voltage than a second select gate of said plural adjacent select gates that is proximate to a cell gate.

22. The device of claim 19, wherein a first select gate of said plural adjacent select gates is biased to function mainly as a select-line gate and a second select gate of said plural adjacent select gates, proximate to a cell gate, is biased to function mainly to reduce gate induced drain leakage (GIDL) leakage currents, wherein the second select gate is biased at a higher voltage than the first select gate.

23. The device of claim 17, wherein the select-gate structure comprises plural serially connected select gates.

24. The device of claim 17, wherein the select-gate structure comprises a single select gate.

25. The device of claim 17, wherein the device comprises a NAND Flash memory device.

26. A method for fabricating a non-volatile semiconductor memory device, the method comprising:
   forming a first select-gate structure on a cell region of a substrate;
   forming a second select-gate structure on the cell region of the substrate, wherein the first select-gate structure and the second select-gate structure are spaced apart from each other, and wherein at least one of the first and second select-gate structures comprises plural select gates; and
   forming a plurality of cell gate structures between the first select-gate structure and the second select-gate structure, on the cell region of the substrate.

* * * * *